(12) United States Patent
Kaneko

(10) Patent No.: US 6,308,306 B1
(45) Date of Patent: Oct. 23, 2001

(54) DELAY ROUTE SEARCHING METHOD AND APPARATUS FOR LOGICAL CIRCUITS, AND MACHINE-READABLE RECORDING MEDIUM RECORDING PROGRAM THEREON

(75) Inventor: Nobuyuki Kaneko, Ishikawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/256,770

(22) Filed: Feb. 24, 1999

(30) Foreign Application Priority Data

Feb. 27, 1998 (JP) .................................................. 10-064678

(51) Int. Cl.[7] .................................................. G06F 17/50
(52) U.S. Cl. .................................................. 716/6; 716/12
(58) Field of Search ........................................... 716/6, 12

(56) References Cited

U.S. PATENT DOCUMENTS

| | | | | |
|---|---|---|---|---|
| 5,452,228 | * | 9/1995 | Arakawa et al. ......................... | 716/6 |
| 5,528,511 | * | 6/1996 | Hasegawa ................................ | 716/6 |
| 5,841,673 | * | 11/1998 | Kobayashi et al. ....................... | 716/6 |
| 6,090,150 | * | 7/2000 | Tawada ..................................... | 716/6 |

FOREIGN PATENT DOCUMENTS 6-119411    4/1994   (JP) .

* cited by examiner

Primary Examiner—Trong Phan
(74) Attorney, Agent, or Firm—Young & Thompson

(57) ABSTRACT

In order to reduce the required storage capacity as well as the processing time in a delay route searching technique for logical circuits, a fan-out direction delay time calculating means 22 figures out, for each component of a logical circuit, the worst transit time from the starting point; and a fan-in direction delay time calculating means 23 figures out, for each component of the logical circuit, the worst remaining time from that component to the end point. A delay analysis non-needing component identifying means 24 adds the corresponding pairs of the worst transit time and the worst remaining time calculated by the fan-out direction delay time calculating means 22 and the fan-in direction delay time calculating means 23 for each component, compares the resultant sums with the pertinent design standards on delay time, and thereby identifies components needing no delay analysis beyond which delay route search processing can be dispensed with, while the delay analysis non-needing component-reflecting delay route searching means 21 performs delay route searching covering no component beyond the components needing no delay analysis.

14 Claims, 15 Drawing Sheets

FIG. 4

| Route | Delay time |
|---|---|
| A → K | 1 |
| B → K | 1 |
| B → M | 1 |
| K → L | 1 |
| L → X | 2 |
| L → N | 2 |
| M → L | 2 |
| M → N | 3 |
| N → Y | 1 |

FIG. 5

| Component | Worst transit time |
|---|---|
| Starting point A | 0 |
| Starting point B | 0 |
| Passage point K | 1 |
| Passage point L | 3 |
| Passage point M | 1 |
| Passage point N | 5 |
| End point X | 5 |
| End point Y | 6 |

FIG. 6

| Component | Worst remaining time |
|---|---|
| Starting point A | 5 |
| Starting point B | 6 |
| Passage point K | 4 |
| Passage point L | 3 |
| Passage point M | 5 |
| Passage point N | 1 |
| End point X | 0 |
| End point Y | 0 |

FIG. 7

| Component | Sum of worst transit time and worst remaining time |
|---|---|
| Starting point A | 5 |
| Starting point B | 6 |
| Passage point K | 5 |
| Passage point L | 6 |
| Passage point M | 6 |
| Passage point N | 6 |
| End point X | 5 |
| End point Y | 6 |

PRIOR ART

FIG. 10

| Starting point | Delay time | Immediately preceding component |
|---|---|---|
| A | TA1 | A |
| B | TB1 | B |

Information on component G1

PRIOR ART

FIG. 11

| Starting point | Delay time | Immediately preceding component |
|---|---|---|
| A | None | None |
| B | TB4 | B |

Information on component G4

PRIOR ART

FIG. 12

| Starting point | Delay time | Immediately preceding component |
|---|---|---|
| A | TA2 | A |
| B | TB4+T42 | G4 |

Information on component G2

PRIOR ART

FIG. 13

| Starting point | Delay time | Immediately preceding component |
|---|---|---|
| A | TA2+T23 | G2 |
| B | TB4+T42+T23 | G2 |

Information on component G3

PRIOR ART

FIG. 14

| Starting point | Delay time | Immediately preceding component |
|---|---|---|
| A | $TA1 + T1X$ | G1 |
| B | $TB1 + T1X$ | G1 |

Information on end point X

PRIOR ART

FIG. 15

| Starting point | Delay time | Immediately preceding component |
|---|---|---|
| A | TA2+T23+T3Y | G3 |
| B | TB4+T42+T23+T3Y | G3 |

Information on end point Y

DELAY ROUTE SEARCHING METHOD AND APPARATUS FOR LOGICAL CIRCUITS, AND MACHINE-READABLE RECORDING MEDIUM RECORDING PROGRAM THEREON

BACKGROUND OF THE INVENTION

1. Field of the Invention

The present invention relates to a delay route searching technique for logical circuits including LSIs, and more particularly to a delay route searching technique capable of reducing the process time and the storage capacity needed for the processing of delay route searching.

2. Description of the Related Art

When designing a logical circuit such as an LSI, it is necessary to search for any delay route and find out whether or not there is a logical path failing to satisfy the design standard on delay time. In doing so, if it is tried to individually assess the delay time of every logical pass in the logical circuit, tracing of the same route is often duplicated, taking an unnecessarily long processing time.

In order to solve this problem, the following method has been proposed (for instance as disclosed in the Japanese Patent Laid-open No. Hei 6-119411). This method will be described below with reference to FIG. 9, wherein reference signs A and B denote starting points; X and Y, end points; and G1 through G4, components positioned between the starting points and the end points.

By this method, first regarding component G1, the worst delay time TA1 from starting point A is figured out, and so is the worst delay time TB1 from starting point B at the same time. In this context, the longest delay time is deemed to be the worst delay time. After that, as information on component G1, as illustrated in FIG. 10, the identifier of starting point A, the delay time TA1 and the identifier of the immediately preceding component (starting point A in this case) on the route where the worst delay time occurs are stored in coordination with one another, and at the same time the identifier of starting point B, the delay time TB1 and the identifier of the immediately preceding component (starting point B in this case) on the route where the worst delay time occurs are also stored in coordination with one another.

Next, component G4 is subjected to similar processing, and such information as listed in FIG. 11 is stored as information on component G4. TB4 denotes the worst delay time between starting point B and component G4.

Then, regarding component G2, the worst delay time TA2 from starting point A is calculated, and so is the worst delay time TB2 from starting point B at the same time. The abovementioned delay time TB2 is figured out by adding the delay time TB4 stored as information on component G4 and the delay time T42 between components G4 and G2. After that, such information as listed in FIG. 12 is stored as information concerning component G2.

Next, regarding component G3, the worst delay time TA3 from starting point A is figured out, and so is the worst delay time TB3 from starting point B at the same time. The worst delay time TA3 is figured out in the following manner. The already stored worst delay time TA1 (see FIG. 10) from starting point A to component G1 and the delay time T13 between components G1 and G3 are added (TA1+T13), and the already stored worst delay time TA2 (see FIG. 12) from starting point A to component G2 and the delay time T23 between components G2 and G3 are added (TA1+T23). After that, the two sums are compared, and the greater sum is supposed to be the worst delay time TA3 from starting point A. Now, if (TA1+T13) is found smaller than (TA2+T23) for instance, the worst delay time TA3 from starting point A to component G3 is (TA2+T23). The worst delay time TB3 from starting point B to component G3 (which in this case is supposed to be TB4+T42+T23) can be calculated n the same manner. After that, such information as listed in FIG. 13 is stored as information on component G3.

End points X and Y are also subjected to similar processing, and information on these end points X and Y, such as shown in FIGS. 14 and 15, respectively, is stored.

By comparing the delay times in the information on end points X and Y shown in FIGS. 14 and 15, respectively, with the pertinent design standard on delay time, it can be found out whether or not there is any logical path violating the delay standard. Further, by using the identifier of the immediately preceding component included in the information shown in FIGS. 10 through 15, the logical path having the worst delay time can be identified.

According to the prior art method described above, since no duplication occurs in the tracing of routes, the processing time can be shorter than in the case where the delay time on every logical path in the logical circuit is individually figured out.

However, the above-described method according to the prior art, which needs the storage of information on each component and each end point with respect to every starting point (the worst delay time from the starting point, and the immediately preceding component), entails the problem of requiring a large storage capacity. Moreover, since it is needed to calculate the worst delay time for each component and each end point with respect to every starting point, the processing time cannot be reduced substantially. Although the logical circuit illustrated in FIG. 9 has only two starting points, an actual logical circuit, such as an LSI, may have dozens of starting points, necessitating a much greater storage capacity and a much longer processing time.

Besides the technique described above, the prior art includes another proposed technique, by which pre-layout-design delay information and post-layout-design delay information, for example, are compared, arcs for which the delay time in the post-layout-design delay information is longer are detected, and delay analyses are conducted only of routes involving the detected arcs (e.g. the Japanese Patent Laid-open No. Hei 9-6836). This technique, however, involves the problem that it is applicable only where pre-layout-design delay information and post-layout-design delay information are available.

SUMMARY AND OBJECT OF THE INVENTION

An object of the present invention, therefore, is to make it possible to reduce the processing time and the storage capacity required for searching delay routes without having to make available any special information.

In order to achieve the above-stated object, a delay route searching method for logical circuits according to the invention comprises:

a fan-out direction delay time calculating step to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;

a fan-in direction delay time calculating step to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;

a delay analysis non-needing component identifying step to add the worst transit time stored at said fan-out direction delay time calculating step to the worst remaining time stored at said fan-in direction delay time calculating step with respect to each target component, to compare the result of each such addition with a design standard delay time, and to ,if the addition result is not larger than the design standard delay time, determine as a free-of-delay-analysis component the target component on which that addition result has been obtained; and a delay analysis non-needing component-reflecting delay route searching step to perform delay route searching on the routes except for all the routes involving the free-of-delay-analysis component.

In order to achieve the above-stated object, a delay route searching apparatus for logical circuits according to the invention comprises:

a fan-out direction delay time calculating means to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;

a fan-in direction delay time calculating means to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;

a delay analysis non-needing component identifying means to add the worst transit time stored by said fan-out direction delay time calculating means to the worst remaining time stored by said fan-in direction delay time calculating means with respect to each target component, to compare the result of each such addition with a design standard delay time, and to, if the addition result is not larger than the design standard delay time, determine as a free-of-delay-analysis component the target component on which that addition result has been obtained; and a delay analysis non-needing component-reflecting delay route searching means to perform delay route searching on the routes except for all the routes involving the free-of-delay-analysis component.

BRIEF DESCRIPTION OF THE DRAWINGS

The invention will be understood more fully from the detailed description given here below and from the accompanying drawings of preferred embodiments of the invention, which, however, should not be regarded as limiting the invention but are merely for explanation and facilitating understanding.

FIG. 4 is a table listing the delay times between components in the logical circuit shown in FIG. 3.

FIG. 5 is a table listing the worst transit times for components in the logical circuit shown in FIG. 3.

FIG. 6 is a table listing the worst remaining times for components in the logical circuit shown in FIG. 3.

FIG. 7 is a diagram for describing the processing by the delay analysis non-needing component identifying means 24.

FIG. 10 is a table listing pieces of information needing storage according to prior art.

FIG. 11 is a table listing pieces of information needing storage according to the prior art.

FIG. 12 is a table listing other pieces of information needing storage according to the prior art.

FIG. 13 is a table listing still other pieces of information needing storage according to the prior art.

FIG. 14 is a table listing yet other pieces of information needing storage according to the prior art.

FIG. 15 is a table listing further pieces of information needing storage according to the prior art.

Here, it should be noted that like reference numerals represent like elements throughout the disclosure.

DETAILED DESCRIPTION OF THE PREFERRED EMBODIMENTS

Next will be described preferred embodiments of the present invention in detail with reference to drawings.

Figure 1:
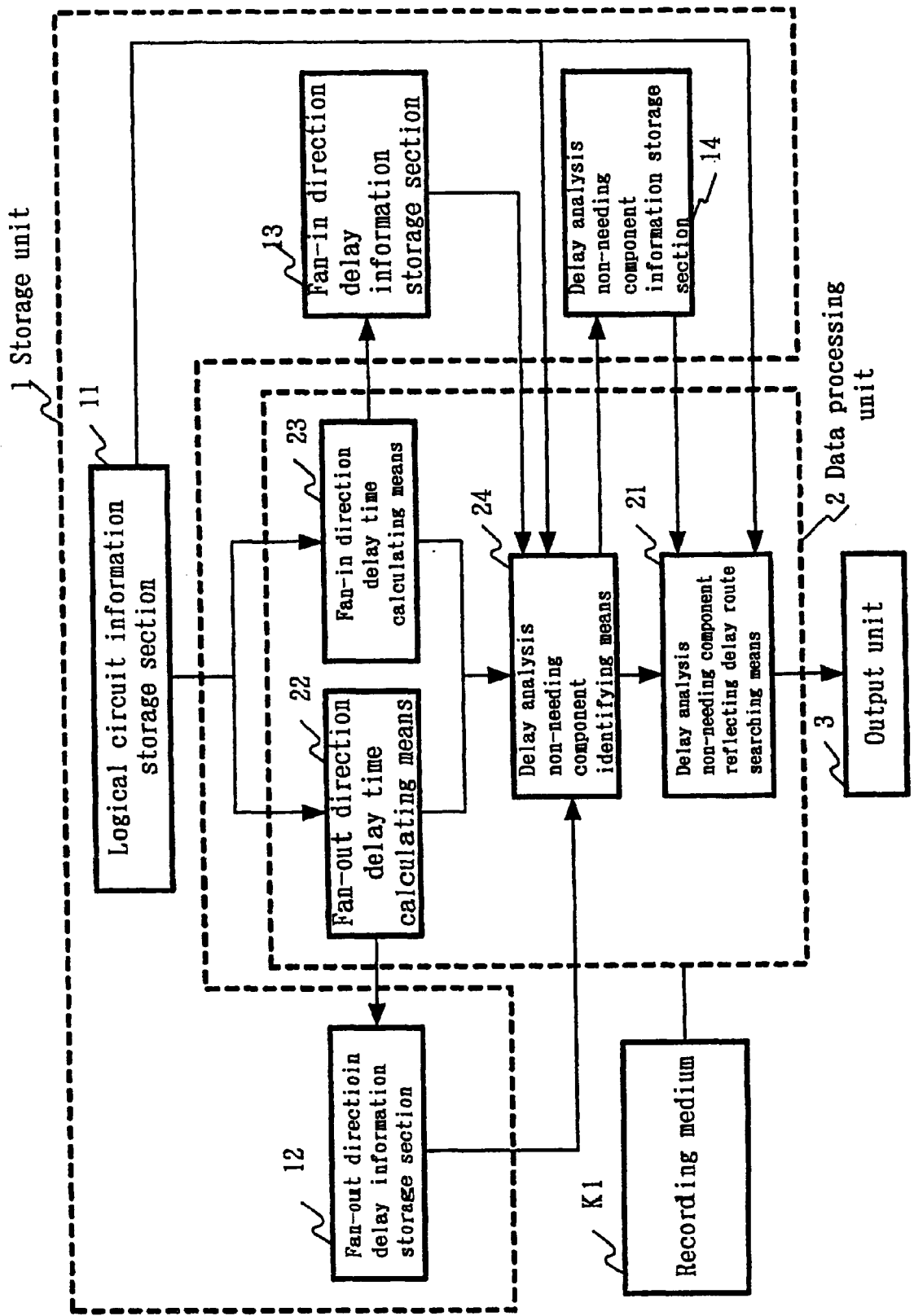
FIG. 1 is a block diagram of a preferred embodiment of the present invention.

FIG. 1 is a block diagram of a preferred embodiment of the invention, comprising a storage unit 1 for storing information, a data processing unit 2 consisting of a computer operating under programmed control, an output unit 3, such as a display unit or a printer, and a recording medium K1, such as a disk or a semiconductor memory.

The storage section 1 is provided with a logical circuit information storage section 11, a fan-out direction delay time information storage section 12, a fan-in direction delay time information storage section 13, and a delay analysis non-needing component information storage section 14.

The logical circuit information storage section 11 stores information on connection between components constituting a logical circuit, such as an LSI, to be subjected to delay analysis processing, delay time information for each of the components constituting the logical circuit, and design standards on delay time.

The fan-out direction delay time information storage section 12 stores the worst transit time, for each of the components of the logical circuit, to that component from each component serving as the starting point of a logical path. The fan-in direction delay time information storage section 13 stores the worst remaining time, for each of the components of the logical circuit, from that component to each component serving as the end point of a logical path.

The worst transit time or the worst remaining time referred to above corresponds to the longest delay time where the design standard on delay time stored in the logical circuit information storage section 11 indicates the length of time which the actual delay time should not exceed (the permissible maximum delay time). Conversely, where the design standard on delay time indicates the length of time which the actual delay time should not fall short of (the permissible minimum delay time), it corresponds to the shortest delay time.

The delay analysis non-needing component information storage section 14 stores the identifiers of components beyond which delay route searching can be dispensed with (delay analysis non-needing components).

In the recording medium K1 connected to the data processing unit 2 is recorded a delay route searching program, which, by being read in by the data processing unit 2, realizes a delay analysis non-needing component-reflecting delay route searching means 21, a fan-out direction delay time calculating means 22, a fan-in direction delay time calculating means 23, and a delay analysis non-needing component identifying means 24 on the data processing unit 2.

The fan-out direction delay time calculating means 22 has a function to calculate, for each component, the worst transit time to that component from each component serving as a starting point, while searching a route from the starting point of a logical path in the fan-out direction (the direction in which signals flow) on the basis of information on connection between components and delay time information for each component stored in the logical circuit information storage section 11, and a function to store the worst transit time calculated for each component into the fan-out direction delay time information storage section 12.

The fan-in direction delay time information storage section 13 has a function to calculate, for each component, the worst remaining time from that component to each component serving as an end point, while searching a route from the end point of a logical path in the fan-in direction (the direction reverse to that in which signals flow) on the basis of information on connection between components and delay time information for each component stored in the logical circuit information storage section 11, and a function to store the worst remaining time calculated for each component into the fan-in direction delay time information storage section 13.

The delay analysis non-needing component identifying means 24 has a function to calculate, for each component, the worst of the delay times of logical paths passing that component on the basis of the stored contents of the fan-out direction delay time information storage section 12 and those of the fan-in direction delay time information storage section 13; a function to identify the identifier of any component beyond which delay route searching can be dispensed with on the basis of the worst delay time calculated for each component and the pertinent design standard on delay time stored in the logical circuit information storage section 11; and a function to store the identifiers of the delay analysis non-needing components into the delay analysis non-needing component information storage section 14.

The delay analysis non-needing component-reflecting delay route searching means 21 has a function to perform delay route searching only on components needing delay analysis processing and delay analysis processing on the basis of information on connection between components and delay time information for each component stored in the logical circuit information storage section 11 and the identifiers of the delay analysis non-needing components stored in the delay analysis non-needing component information storage section 14.

Figure 2:
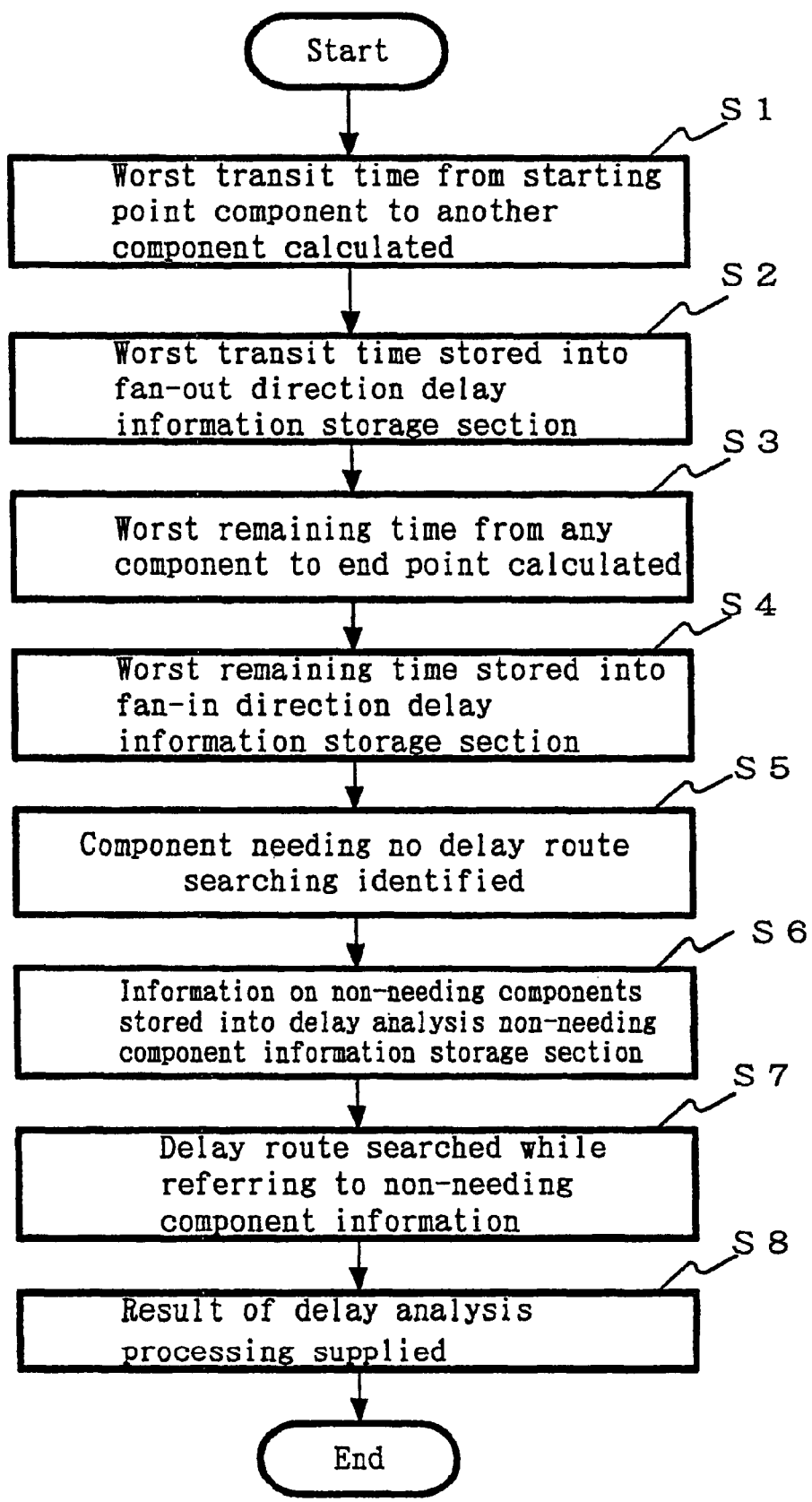
FIG. 2 is a flow chart showing an example of processing by the data processing unit 2.

FIG. 2 is a flow chart showing an example processing by the data processing unit 2. The operation of this embodiment of the invention will be described below with reference to relevant drawings.

Figure 3:
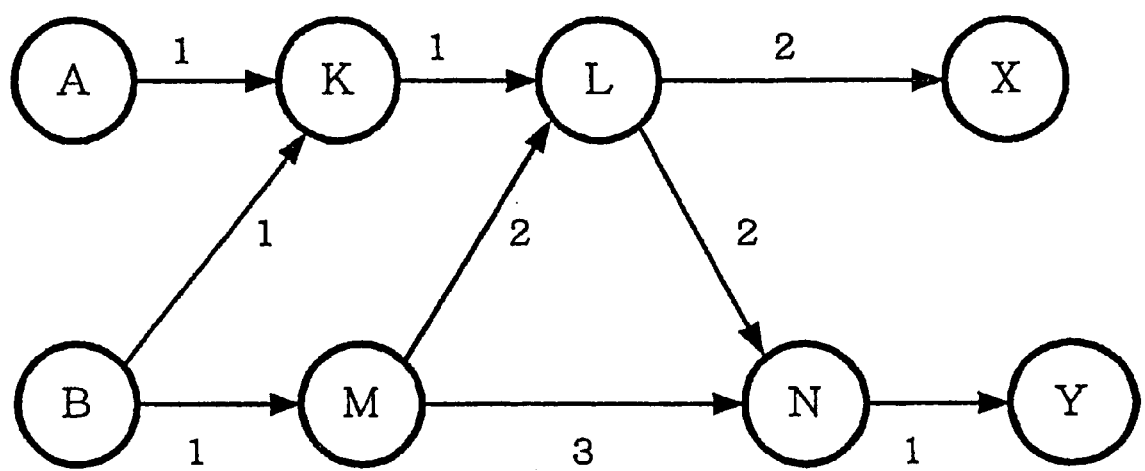
FIG. 3 is a diagram illustrating delay times between components in a logical circuit to be subjected to delay route searching.

Now it is supposed that the logical circuit to be subjected to delay analysis processing is what is shown in FIG. 3, for instance, though FIG. 3 shows only a modeled logical circuit. This logical circuit illustrated in FIG. 3 consists of components A and B to serve as starting points of logical paths, components X and Y to serve as end points of the logical paths, and components L, M and N to serve as passage points on the way of the logical paths, and there are connective relationships of signal flows in the directions of A→K, K→L, L→X, B→M, M→N, N→Y, B→K, M→L and L→N. The delay times between components between which signals flow are listed in FIG. 4. Thus, the information in FIG. 4 concerns delay times between the components constituting the logical circuit, and this information is stored in the logical circuit information storage section 11.

In processing delay analysis on the logical circuit as illustrated in FIG. 3, first the fan-out direction delay time calculating means 22 calculates, for each of components A, B, K, L, M, N, X and Y, the worst transit times from components A and B, serving as starting points, on the basis of circuit information stored in the logical circuit information storage section 11 for the aforementioned logical circuit (S1). This calculation of the worst transit times can be easily accomplished by using a general solution to the problem of shortest cut searching (such as the Dijkstra method).

The worst transit time here, as stated above, differs depending upon whether the design standard on delay time prescribes the permissible maximum delay time or the permissible minimum delay time. Now, if the design standard on delay time prescribes the permissible maximum delay time, for example, processing by the fan-out direction delay time calculating means 22 will be as follows.

For instance component K, which constitutes a passage point, serves two routes from components A and B as starting points, i.e. A→K and B→K, and because in this case the worst delay time is "1" for both routes, A→K and B→K, "1" is figured out as the worst transit time. Component L, which constitutes another passage point, serves three routes from components A and B as starting points, i.e. A→K→L, B→K→L and B→M→L, and because the delay times of the three routes are "2", "2" and "3", respectively, the longest delay time "3" is figured out as the worst transit time. The worst transit time from components A and B as starting points to component L can be figured out by, for example, choosing the greater of two values, one being "2" resulting from the addition of the delay time "1" between K and L to the already found worst transit time "1" to component K and the other being "3" resulting from the addition of the delay time "2" between M and L to the already found worst transit time "1" to component M. The worst transit time can be similarly figured out for any other component. To add, where the design standard on delay time is the permissible minimum delay time, the shortest delay time corresponds to the worst transit time.

Having figured out the worst transit times for all the components A, B, K, L, M, N, X and Y as listed in FIG. 5, the fan-out direction delay time calculating means 22 stores them into the fan-out direction delay time information storage section 12 (S2). In doing so, the fan-out direction delay time calculating means 22 stores only the worst transit times in coordination with the identifiers of components A, B, K, L, M, N, X and Y, but need not store route information (where is the starting point? and what is the immediately preceding component?) as mentioned with reference to the prior art. Accordingly, the storage capacity can be smaller than according to the prior art. Furthermore, as the fan-out direction delay time calculating means 22 stores only the worst transit time for each component, but need not calculate the worst delay time for each component with respect to every starting point as according to the prior art, the quantity of calculations can be significantly reduced, and so can be the processing time as well. Where the number of starting points is N, the quantity of calculations and the processing time can be reduced to 1/N or even less. Considering that there may be dozens of starting points in a logical circuit such as an LSI, the savings in storage capacity and processing time can be tremendous.

Next, the fan-in direction delay time calculating means 23 calculates, for each of components A, B, K, L, M, N, X and Y, the worst remaining times for that component to components X and Y as end points on the basis of the stored contents of the logical circuit information storage section 11 (S3). For this calculation of the worst remaining time, too, a general solution to the problem of shortest cut searching can be used.

For instance component K, which constitutes a passage point, serves two routes to components X and Y as end points, i.e. K→L→X and K→L→N→Y, and because in this case the respective delay times are "3" and "4", the longest delay time "4" is figured out as the worst remaining time. Or component M, which constitutes another passage point, serves three routes to components X and Y as end points, i.e. M→L→X, N→L→N→Y and M→N→Y, and because the delay times of the three routes are "4", "5" and "4", respectively, the longest delay time "5" is figured out as the worst remaining time. To add, where the design standard on delay time is the permissible minimum delay time, the shortest delay time can be supposed to be the worst remaining time.

As the worst remaining times for all the components A, B, K, L, M, N, X and Y are figured out as listed in FIG. 6, the fan-in direction delay time calculating means 23 stores them into the fan-in direction delay time information storage section 13 (S4). In doing so, the fan-in direction delay time calculating means 23 stores only the worst remaining times in coordination with the identifiers of components A, B, K, L, M, N, X and Y, but need not store route information (where is the starting point? and what is the immediately preceding component?) as mentioned with reference to the prior art. Accordingly, the storage capacity can be smaller than according to the prior art. Furthermore, as the fan-in direction delay time calculating means 23 stores only the worst remaining time for each component, but need not calculate the worst delay time for each component with respect to every starting point as according to the prior art, the quantity of calculations can be significantly reduced, and so can be the processing time as well.

After that, the delay analysis non-needing component identifying means 24 identifies components not needing delay route searching on the basis of the worst transit time for each component stored in the fan-out direction delay time information storage section 12, the fan-in direction delay time information storage section 13 and the design standards on delay time stored in the logical circuit information storage section 11 (S5).

This processing at S5 will be described below in further detail. First, the sum of the worst transit time and the worst remaining time is calculated for each component. In the example of FIG. 3, the sum of the worst transit time and the worst remaining time for each component is such as listed in FIG. 7. The sum of the worst transit time and the worst remaining time for each component calculated in this way is equal to the worst delay time among all the logical paths via that component. For instance, between components A and B as starting points and components X and Y as end points via component K, there are four logical paths, A→K→L→X, A→K→L→N→Y, B→K→L→X and B→K→L→N→Y, and the delay times on these paths are "4", "5", "4" and "5", respectively. Thus, the worst delay time among the logical paths via component K is "5", which is identical with the sum "5" of the worst transit time and the worst remaining time for component K listed in FIG. 7.

Next, by comparing the design standards on delay time stored in the logical circuit information storage section 11 and the sum of the worst transit time and the worst remaining time for each component, it is judged whether or not the component satisfies the pertinent design standard on delay time, and components satisfying the corresponding design standards on delay time are recognized as components needing no delay analysis. If, for instance, the design standard on delay time is the permissible maximum delay time and its value is "5", components A, K and X for which the sum of the worst transit time and the worst remaining time is not more than "5" are recognized as components needing no delay analysis. To add, if the design standard on delay time is the permissible minimum delay time, components for which the sum of the worst transit time and the worst remaining time is not less than the design standard on delay time are recognized as components needing no delay analysis. What has been described so far is the details of processing done at S5.

After that, the delay analysis non-needing component identifying means 24 stores the identifiers of the components needing no delay analysis identified at S5, i.e. A, K and X, into the delay analysis non-needing component information storage section 14 (S6).

And finally, the delay analysis non-needing component-reflecting delay route searching means 21 performs delay route searching on the logical circuit (S7) illustrated in FIG. 3, in which pieces of circuit information listed in FIG. 11 are stored, while referring to the identifiers of the delay analysis non-needing components A, K and X stored in the delay analysis non-needing component information storage section 14, and supplies the result of delay analysis processing to the output unit 3 (S8).

Now will be described in detail the processing performed at S7. If any component needing no delay analysis, whose identifier is stored in the delay analysis non-needing component information storage section 14, emerges during delay route searching in the logical circuit, delay route searching beyond that component is dispensed with, and only those logical paths involving no delay analysis non-needing component are searched. In the logical circuit shown in FIG. 3, for instance, since the identifiers of components A, K and X are registered in the delay analysis non-needing component information storage section 14, only two logical paths B→M→L→N→Y and B→M→N→Y are subjected to delay route searching, and the result of delay analysis processing (that B→M→L→N→Y does not satisfy the pertinent design standard on delay time) is supplied to the output unit 3. Accordingly, delay route searching on logical paths A→K→L→X, A→K→L→N→Y, B→K→L→X, B→K→L→N→Y and B→M→L→X is dispensed with, and delay analysis processing can be dispensed with correspondingly. Whereas various delay route searching methods, including depth-preferential searching, are proposed for use in delay analysis processing, any of these methods can give the same effects.

Next will be described in detail another preferred embodiment of the present invention.

Figure 8:
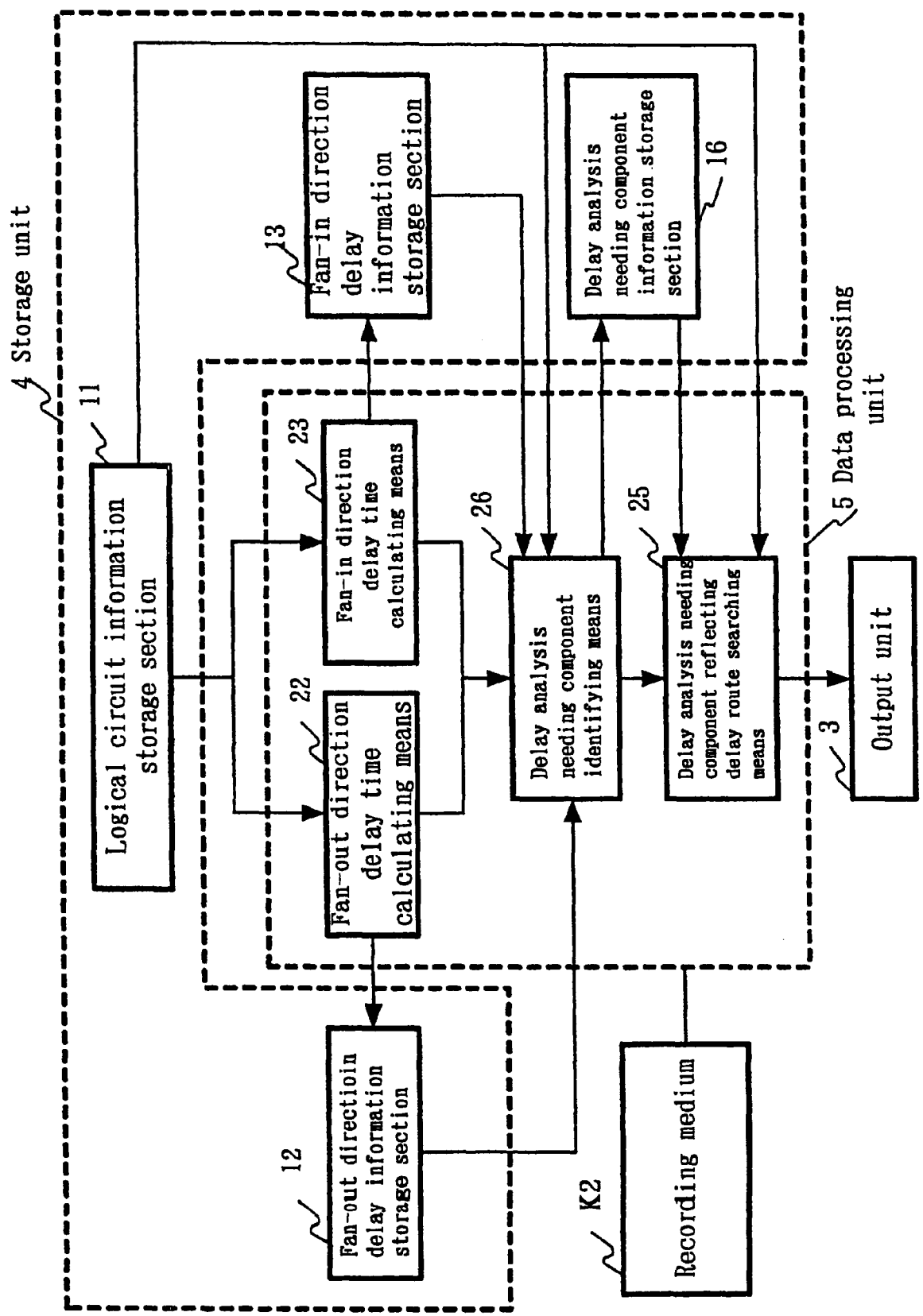
FIG. 8 is a block diagram of another preferred embodiment of the invention.
Figure 9:
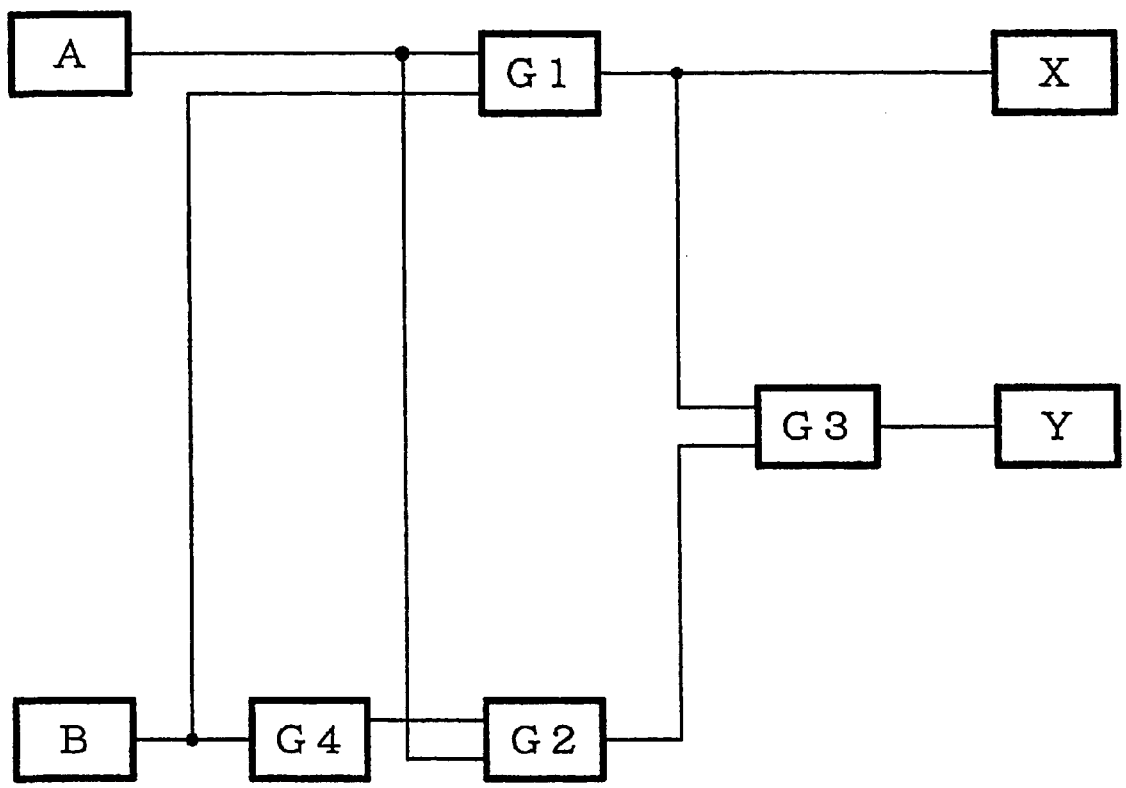
FIG. 9 is a logical circuit diagram for describing an embodiment of the prior art.

FIG. 8 is a block diagram of this other embodiment of the invention, which differs from the embodiment illustrated in FIG. 1 in that a storage unit 4 is provided in place of the storage unit 1; the storage unit 4 is equipped with a delay analysis needing component information storage section 16 in place of the delay analysis non-needing component information storage section 14; a data processing unit 5 is provided in place of the data processing unit 2; the data processing 5 is equipped with a delay analysis needing component-reflecting delay route searching means 25 and a delay analysis needing component identifying means 26 in place of the delay analysis non-needing component-reflecting delay route searching means 21 and the delay analysis non-needing component identifying means 24, respectively; and a recording medium K2 is provided in place of the recording medium K1. To add, like reference signs elsewhere in FIG. 8 represent like elements in FIG. 1.

The recording medium K2 may be a disk, a semiconductor memory or some other recording medium, on which a delay route searching program is recorded, which, by being read in by the data processing unit 5 and controlling the operation of the data processing unit 5, realizes the fan-out direction delay time calculating means 22, the fan-in direction delay time calculating means 23, the delay analysis needing component-reflecting delay route searching means 25, and the delay analysis needing component identifying means 26 on the data processing unit 5.

The delay analysis needing component identifying means 26 has a function to identify, on the basis of the worst transit time of each component stored in the fan-out direction delay time information storage section 12, the worst remaining time of each component stored in the fan-in direction delay time information storage section 13, and the pertinent design standard on delay time stored in the logical circuit information storage section 11, components beyond this component which require delay route searching (delay analysis needing components), and a function to store the identifiers of the delay analysis needing components into the delay analysis needing component information storage section 16.

The delay analysis needing component-reflecting delay route searching means 25 has a function to perform delay route searching only on those logical paths of which delay analysis needing components stored in the delay analysis needing component information storage section 16 serve as starting points, passage points or end points.

Next will be described the operation of this embodiment of the invention with reference to delay analysis processing of the logical circuit shown in FIG. 3 by way of an example.

First, the fan-out direction delay time calculating means 22 performs the same processing as described above, and stores the worst transit times for components A, B, K, L, M, N, X and Y into the fan-out direction delay time information storage section 12.

After that, the fan-in direction delay time calculating means 23 performs the same processing as described above, and stores the worst remaining times for components A, B, K, L, M, N, X and Y into the fan-in direction delay time information storage section 13.

Then the delay analysis needing component identifying means 26 identifies delay analysis needing components on the basis of the worst transit time of each component stored in the fan-out direction delay time information storage section 12, the worst remaining time of each component stored in the fan-in direction delay time information storage section 13, and the pertinent design standard on delay time stored in the logical circuit information storage section 11.

This processing will be described in detail below. First, the sum of the worst transit time and the worst remaining time is calculated for each component. Next, by comparing the design standards on delay time stored in the logical circuit information storage section 11 and the sum of the worst transit time and the worst remaining time for each component, it is judged whether or not the component satisfies the pertinent design standard on delay time, and components not satisfying the corresponding design standards on delay time are recognized as components needing delay analysis. If, for instance, the design standard on delay time is the permissible maximum delay time and its value is "5", components B, L, M, N and Y for which the sum of the worst transit time and the worst remaining time is greater than "5" are recognized as components needing delay analysis (see FIG. 7). After that, the delay analysis needing component identifying means 26 stores the identifiers of the components needing delay analysis, i.e. B, L, M, N and Y, into the delay analysis needing component information storage section 16. To add, if the design standard on delay time is the permissible minimum delay time, components for which the sum of the worst transit time and the worst remaining time is smaller than the design standard on delay time are recognized as components needing delay analysis.

And finally, the delay analysis needing component-reflecting delay route searching means 25 performs delay route searching on the logical circuit illustrated in FIG. 3, on which circuit information is stored in the logical circuit information storage section 11, while referring to the identifiers of the delay analysis needing components stored in the delay analysis needing component information storage section 16, and supplies the result of delay analysis processing to the output unit 3. More specifically, delay route searching in the logical circuit covers only the delay analysis needing components whose identifiers are stored in the delay analysis needing component information storage section 16, is performed only on components beyond them, and involves only the logical paths consisting of the delay analysis needing components whose identifiers are stored in the delay analysis needing component information storage section 16.

In the case of the logical circuit illustrated in FIG. 3, since the identifiers of components B, M, L, N and Y are stored in the delay analysis needing component information storage section 16, the delay analysis needing component-reflecting delay route searching means 25 performs delay route searching on only two logical paths, i.e. B→M→L→N→Y and B→M→L→Y, and supplies the result of delay analysis processing to the output unit 3. Therefore, delay route searching on logical paths A→K→L→X, A→K→L→N→Y, B→K→L→X, B→K→L→N→Y and B→M→L→X is dispensed with, and delay analysis processing can be dispensed with correspondingly.

As hitherto described, the present invention makes it possible to reduce the processing time and the storage capacity required for the processing of delay route processing. The first reason consists in the confinement of the range in which delay route analyses are performed, and the second is that the confinement of the range of delay route analyses is enabled to be accomplished at high speed and with a smaller storage capacity. In other words, the confinement of the range of delay route analyses is accomplished by adding the worst transit time and the worst remaining time for each component, and comparing the result of addition with the design standard on delay time, which involves a smaller quantity of processing and requires no great storage capacity.

Although the invention has been described in detail so far with reference to different preferred embodiments thereof, it will be appreciated by those skilled in the art that these embodiments have been provided solely for illustrative purposes, and are in no way to be regarded as limiting the invention. Instead, various modifications and substitutions of equivalent techniques will be readily apparent to those skilled in the art upon reading this specification, and such modifications and substitutions are to be regarded as falling within the true scope and spirit of the following claims.

What is claimed is:

1. A delay route searching method for logical circuits comprising:

a fan-out direction delay time calculating step to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;

a fan-in direction delay time calculating step to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;

a delay analysis non-needing component identifying step to add the worst transit time stored at said fan-out direction delay time calculating step to the worst remaining time stored at said fan-in direction delay time calculating step with respect to each target component, to compare the result of each such addition with a design standard delay time, and to, if the addition result is not larger than the design standard delay time, determine as a free-of-delay-analysis component the target component on which that addition result has been obtained; and a delay analysis non-needing component-reflecting delay route searching step to perform delay route searching on the routes except for all the routes involving the free-of-delay-analysis component.

2. A delay route searching method for logical circuits comprising:

a fan-out direction delay time calculating step to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;

a fan-in direction delay time calculating step to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;

a delay analysis needing component identifying step to add the worst transit time stored at said fan-out direction delay time calculating step to the worst remaining time stored at said fan-in direction delay time calculating step with respect to each target component, to compare the result of each such addition with a design standard delay time, and to, if the addition result is larger than the design standard delay time, determine as a delay-analysis component the target component on which that addition result has been obtained; and a delay analysis needing component-reflecting delay route searching step to perform delay route searching on all the routes involving the delay-analysis component.

3. A delay route searching method for logical circuits, as claimed in claim 1, wherein:

said worst transit time and said worst remaining time referred to above correspond to the longest delay time where said design standard delay time indicates the permissible maximum delay time, or correspond to the shortest delay time where said design standard delay time indicates the permissible minimum delay time.

4. A delay route searching method for logical circuits, as claimed in claim 2, wherein:

said worst transit time and said worst remaining time referred to above correspond to the longest delay time where said design standard delay time indicates the permissible maximum delay time, or correspond to the shortest delay time where said design standard delay time indicates the permissible minimum delay time.

5. A delay route searching apparatus for logical circuits comprising:

a fan-out direction delay time calculating means to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;

a fan-in direction delay time calculating means to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;

a delay analysis non-needing component identifying means to add the worst transit time stored by said fan-out direction delay time calculating means to the worst remaining time stored by said fan-in direction delay time calculating means with respect to each target component, to compare the result of each such addition with a design standard delay time, and to, if the addition result is not larger than the design standard delay time, determine as a free-of-delay-analysis component the target component on which that addition result has been obtained; and a delay analysis non-needing component-reflecting delay route searching means to perform delay route searching on the routes except for all the routes involving the free-of-delay-analysis component.

6. A delay route searching apparatus for logical circuits comprising:

a fan-out direction delay time calculating means to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;

a fan-in direction delay time calculating means to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;

a delay analysis needing component identifying means to add the worst transit time stored by said fan-out direction delay time calculating means to the worst remaining time stored by said fan-in direction delay time calculating means with respect to each target component, to compare the result of each such addition with a design standard delay time, and to, if the addition result is larger than the design standard delay time, determine as a delay-analysis component the target component on which that addition result has been obtained; and a delay analysis needing component-reflecting delay route searching means to perform delay route searching on all the routes involving the delay-analysis component.

7. A delay route searching apparatus for logical circuits, as claimed in claim 5, wherein:

said worst transit time and said worst remaining time referred to above correspond to the longest delay time where said design standard delay time indicates the permissible maximum delay time, or correspond to the shortest delay time where said design standard delay time indicates the permissible minimum delay time.

8. A delay route searching apparatus for logical circuits, as claimed in claim 6, wherein:

said worst transit time and said worst remaining time referred to above correspond to the longest delay time where said design standard delay time indicates the permissible maximum delay time, or correspond to the shortest delay time where said design standard delay time indicates the permissible minimum delay time.

9. A recording medium on which is recorded a program to enable a computer to perform:

a fan-out direction delay time calculating processing to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;

a fan-in direction delay time calculating processing to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;

a delay analysis non-needing component identifying processing to add the worst transit time stored by said fan-out direction delay time calculating processing to the worst remaining time stored by said fan-in direction delay time calculating processing with respect to each target component, to compare the result of each such addition with a design standard delay time, and to, if the addition result is not larger than the design standard delay time, determine as a free-of-delay-analysis component the target component on which that addition result has been obtained; and a delay analysis non-needing component-reflecting delay route searching processing to perform delay route searching on the routes except for all the routes involving the free-of-delay-analysis component.

10. A recording medium on which is recorded a program to enable a computer to perform:

a fan-out direction delay time calculating processing to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;

a fan-in direction delay time calculating processing to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;

a delay analysis needing component identifying processing to add the worst transit time stored by said fan-out direction delay time calculating processing to the worst remaining time stored by said fan-in direction delay time calculating processing with respect to each target component, to compare the result of each such addition with a design standard delay time, and to, if the addition result is larger than the design standard delay time, determine as a delay-analysis component the target component on which that addition result has been obtained; and a delay analysis needing component-reflecting delay route searching processing to perform delay route searching on all the routes involving the delay-analysis component.

11. A group of recording media, wherein said program of claim 9 is divided into a plurality of portions and said portions are recorded on said media, respectively.

12. A group of recording media, wherein said program of claim 10 is divided into a plurality of portions and said portions are recorded on said media, respectively.

13. A program embodying electrical signals enabling a computer to perform:
- a fan-out direction delay time calculating processing to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;
- a fan-in direction delay time calculating processing to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;
- a delay analysis non-needing component identifying processing to add the worst transit time stored by said fan-out direction delay time calculating processing to the worst remaining time stored by said fan-in direction delay time calculating processing with respect to each target component, to compare the result of each such addition with a design standard delay time, and to, if the addition result is not larger than the design standard delay time, determine as a free-of-delay-analysis component the target component on which that addition result has been obtained; and
- a delay analysis non-needing component-reflecting delay route searching processing to perform delay route searching on the routes except for all the routes involving the free-of-delay-analysis component.

14. A program embodying electrical signals enabling a computer to perform:
- a fan-out direction delay time calculating processing to calculate the transit time from at least one component as a starting component, which is a starting point in a group of components constituting a logical circuit to be subjected to delay route searching, to the other components as target components, and to store the name of each of the target components and the worst one of all the calculated transit times with respect to that target component;
- a fan-in direction delay time calculating processing to calculate the remaining time to at least one component as a ending component, which is an end point in the group of components constituting the logical circuit to be subjected to delay route searching, from the other components as target components, and to store the name of each of the target components and the worst one of all the calculated remaining times with respect to that target component;
- a delay analysis needing component identifying processing to add the worst transit time stored by said fan-out direction delay time calculating processing to the worst remaining time stored by said fan-in direction delay time calculating processing with respect to each target component, to compare the result of each such addition with a design standard delay time, and to, if the addition result is larger than the design standard delay time, determine as a delay-analysis component the target component on which that addition result has been obtained; and
- a delay analysis needing component-reflecting delay route searching processing to perform delay route searching on all the routes involving the delay-analysis component.

\* \* \* \* \*